United States Patent
Yokoyama et al.

(10) Patent No.: US 7,799,158 B2
(45) Date of Patent: Sep. 21, 2010

(54) METHOD FOR PRODUCING CRYSTALLOGRAPHICALLY-ORIENTED CERAMIC

(75) Inventors: Shohei Yokoyama, Nagoya (JP); Nobuyuki Kobayashi, Nagoya (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 82 days.

(21) Appl. No.: 12/013,602

(22) Filed: Jan. 14, 2008

(65) Prior Publication Data
US 2008/0295948 A1    Dec. 4, 2008

Related U.S. Application Data

(60) Provisional application No. 60/948,751, filed on Jul. 10, 2007.

(30) Foreign Application Priority Data

May 28, 2007    (JP)    ............... 2007-140833
Oct. 31, 2007    (JP)    ............... 2007-283186

(51) Int. Cl.
C03B 29/00    (2006.01)
C30B 19/00    (2006.01)
C30B 9/00    (2006.01)
C30B 3/00    (2006.01)

(52) U.S. Cl. ............... 156/89.11; 117/4; 117/7; 117/8; 117/9; 117/63; 117/59; 117/74; 117/83; 117/902

(58) Field of Classification Search ............... 156/89.11; 117/54, 97, 63, 74, 83, 902, 4, 7, 8, 9
See application file for complete search history.

(56) References Cited

U.S. PATENT DOCUMENTS 5,071,828 A * 12/1991 Greuter et al. ............... 505/425

(Continued)

FOREIGN PATENT DOCUMENTS

EP    826643 A1 *    3/1998

(Continued)

OTHER PUBLICATIONS

Min-Chul Chae, et al., "*Effect of Zn Substitution on Dielectric Responses of 0.2PMT•0.8PMN Ceramics*," Journal of the European Ceramic Society, vol. 22, No. 11, Oct. 1, 2002, pp. 1857-1861.

*Primary Examiner*—Philip C Tucker
*Assistant Examiner*—Alex Efta
(74) *Attorney, Agent, or Firm*—Burr & Brown

(57) ABSTRACT

A method for producing a crystallographically-oriented ceramic includes the steps of forming a first sheet with a thickness of 10 μm or less containing a first inorganic material in which grain growth occurs at a first temperature or higher and a second sheet containing a second inorganic material in which grain growth occurs at a second temperature higher than the first temperature, laminating one or more each of the first and second sheets to form a laminated body, firing the laminated body at a temperature equal to or higher than the first temperature and lower than the second temperature to cause grain growth in the first inorganic material, and then firing the laminated body at a temperature equal to or higher than the second temperature to cause grain growth in the second inorganic material in the direction of a crystal plane of the first inorganic material.

11 Claims, 4 Drawing Sheets

U.S. PATENT DOCUMENTS

| | | | |
|---|---|---|---|
| 5,514,484 A * | 5/1996 | Nashimoto | 428/700 |
| 5,525,434 A * | 6/1996 | Nashimoto | 428/824 |
| 6,503,573 B1 | 1/2003 | Horwitz et al. | |
| 6,551,652 B2 * | 4/2003 | Qiu et al. | 427/100 |
| 2002/0035961 A1 * | 3/2002 | Natori et al. | 117/54 |
| 2003/0034523 A1 * | 2/2003 | Hiroshima | 257/347 |
| 2004/0227278 A1 * | 11/2004 | Kijima et al. | 264/615 |
| 2006/0205097 A1 | 9/2006 | Kadotani et al. | |

FOREIGN PATENT DOCUMENTS

| | | |
|---|---|---|
| EP | 1 777 203 A1 | 4/2007 |
| JP | 10-330184 A1 | 12/1998 |
| JP | 2004-189506 A1 | 7/2004 |

* cited by examiner

METHOD FOR PRODUCING CRYSTALLOGRAPHICALLY-ORIENTED CERAMIC

BACKGROUND OF THE INVENTION

1. Field of the Invention

The present invention relates to methods for producing crystallographically-oriented ceramics.

2. Description of the Related Art

To date, as the method for producing a crystallographically-oriented ceramic, a method has been proposed which includes a mixing step of mixing a host material A having shape anisotropy and a guest material B having crystal coherency with at least one crystal plane of the host material A and low crystal anisotropy, an orienting step of orienting a crystal plane of the host material A, and a firing step of heating the mixture to orient a crystal plane of the guest material B, and in which it is possible to obtain a ceramic with enhanced orientation even if the guest material B having low crystal anisotropy is used (for example, refer to Japanese Unexamined Patent Application Publication No. 10-330184).

SUMMARY OF THE INVENTION

However, in the method described in Japanese Unexamined Patent Application Publication No. 10-330184, a step of growing the crystal plane of the host material A, such as a step of firing the host material A, a step of crushing the host material A, the crystal plane of which has been grown, so that orientation can be performed in the orienting step, and other steps are separately required. Thus, cumbersome processing is required to enhance the crystallographic orientation.

The present invention has been achieved in consideration of the problems described above. An object of the invention is to provide a method for producing a crystallographically-oriented ceramic in which crystallographic orientation can be enhanced by simpler processing.

In order to achieve the object described above, the present invention provides the method described below.

That is, a method for producing a crystallographically-oriented ceramic according to the present invention includes a shaping step of forming a first shaped layer with a thickness of 10 µm or less containing a first inorganic material in which grain growth occurs at a predetermined first temperature or higher and a second shaped layer containing a second inorganic material in which grain growth occurs at a second temperature higher than the first temperature, a laminating step of laminating one or more each of the first shaped layer and the second shaped layer to form a laminated body, and a firing step of the laminated body at a temperature equal to or higher than the first temperature and lower than the second temperature to cause grain growth in the first inorganic material, and then firing the laminated body at a temperature equal to or higher than the second temperature to cause grain growth in the second inorganic material in the direction of a crystal plane of the first inorganic material in which grain growth has occurred.

In the method for producing the crystallographically-oriented ceramic, a first shaped layer with a thickness of 10 µm or less containing a first inorganic material in which grain growth occurs at a predetermined first temperature or higher and a second shaped layer containing a second inorganic material in which grain growth occurs at a second temperature higher than the first temperature are formed, a laminated body is formed by laminating one or more each of the first shaped layer and the second shaped layer, and then the laminated body is fired at a temperature equal to or higher than the first temperature and lower than the second temperature to cause grain growth in the first inorganic material. In this stage, since the first shaped layer has a thickness of 10 µm or less, grain growth in the thickness direction of the layer is limited in the first inorganic material, and grain growth is more promoted in a direction along the contact surface with the second shaped layer. Subsequently, the laminated body is fired at a temperature equal to or higher than the second temperature to cause grain growth in the second inorganic material. In this stage, in the second inorganic material, grain growth proceeds along the direction of the grains of the first inorganic material which have grown along the contact surface. In such a manner, grain growth occurs in a certain direction as a whole. Consequently, it is possible to enhance crystallographic orientation by simple processing compared with a case where a first inorganic material in which grain growth has been caused by firing is crushed, the crushed first inorganic material is mixed and shaped with a second inorganic material, and the resulting shaped body is fired again.

DETAILED DESCRIPTION OF THE INVENTION

Figure 1A:
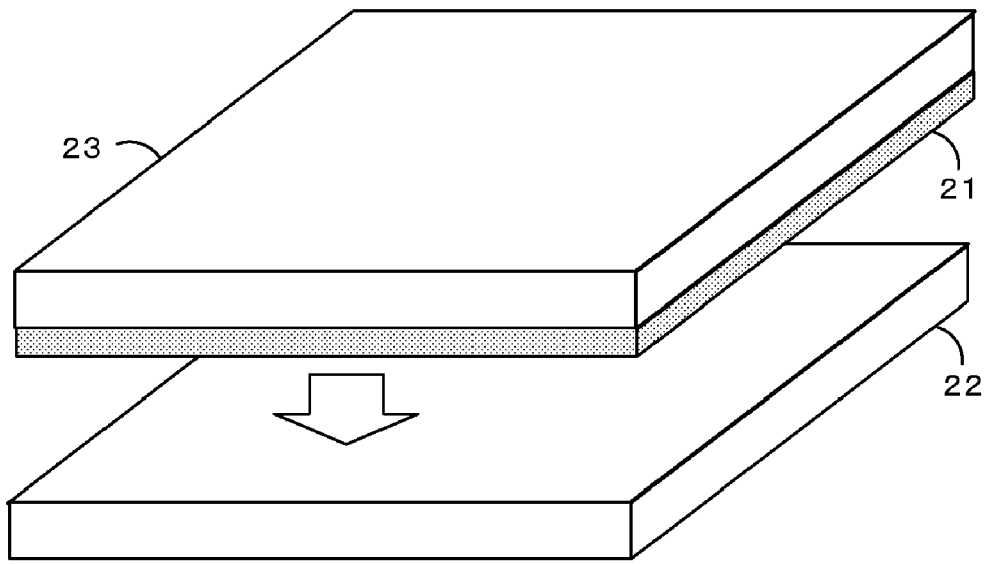
FIGS. 1A to 1C are views schematically showing an example of a laminating step, FIG. 1A showing the individual sheets, FIG. 1B showing a state in which the sheets are pressure-bonded to each other, FIG. 1C showing a supporting member being removed.

A method for producing a crystallographically-oriented ceramic according to the present invention includes (1) a preparation step of preparing a first inorganic material and a second inorganic material in which grain growth occurs at a temperature higher than that of the first inorganic material, each of the first and second inorganic materials being a raw material for a ceramic sheet (hereinafter also referred to as a "sheet") which is a shaped layer; (2) a shaping step of forming a first sheet from the first inorganic material and forming a second sheet from the second inorganic material; (3) a laminating step of laminating alternately the shaped sheets to form a laminated body; and (4) a firing step of the laminated body in two stages at different temperatures. The individual steps will be described below in that order with reference to the drawings.

(1) Preparation Step of Preparing Inorganic Materials

Examples of inorganic materials that can be used for the ceramic sheet include inorganic materials that grow into crystal grains with an anisotropic shape under predetermined firing conditions, namely, the growth form under predetermined firing conditions is crystal grains with an anisotropic shape; and inorganic materials that grow into crystal grains with an isotropic and polyhedral shape under predetermined firing conditions, namely, the growth form under predetermined firing conditions is crystal grains with an isotropic and polyhedral shape. Among these, inorganic materials which grow into crystal grains with an isotropic and polyhedral shape under predetermined firing conditions are more preferable. Here, the expression "growth form under predetermined firing conditions" is defined as the morphology observed when crystals of inorganic materials come to equilibrium with each other under given heat-treating conditions, which is, for example, obtained by observing the shape of grains at a bulk surface when it is crystallized by firing. Furthermore, the term "anisotropic shape" refers to a shape in which the ratio of major axis length to minor axis length (aspect ratio) is large (e.g., with an aspect ratio of 2 or more), such as a tabular, strip-like, columnar, needle-like, or flake-like shape. Furthermore, the "isotropic and polyhedral" shape means, for example, a cubic shape. In general, with respect to the morphology of crystal grains formed by grain growth, if the grain growth temperature is sufficiently low, for example, 400° C. or less, compared with the melting point or decomposition temperature of the solid, the crystal grains are virtually spherically-shaped. In spite of the fact that intrinsically, the atom arrangement is anisotropic and the growth rate differs depending on the crystal plane, grains grow into a spherical shape. The reason for this is that atoms of solids are very difficult to move. On the other hand, if the grain growth temperature is close to the melting point or decomposition temperature of the solid, for example, if the difference in temperature is 200° C. or less, the movement of atoms at the surface of growing grains becomes active, and surface morphology resulting from the crystal structure appears. That is, as grains grow, a difference occurs in the growth rate depending on the crystal plane. Slowly growing crystal planes develop, while rapidly growing crystal planes diminish or disappear. The morphology determined by the difference in plane growth rate is referred to as the growth form. In order to achieve an anisotropic shape or polyhedral shape as the growth form, in addition to the material in which grain growth temperature is close to the melting point or decomposition temperature of the solid as described above, a system in which a low-melting-point compound, such as glass, is added as a flux and grains are grown through the flux is preferably selected. The reason for this is that by adding the flux, the movement of elements constituting the solid at the surface of grains becomes active. As the inorganic materials that grow into a polyhedral shape, inorganic materials that grow into a hexahedral shape are more preferable. In the case of a hexahedron, in grains having two faces parallel to the surface of the planar sheet, four faces other than the two faces are included as the growing planes in all directions in a shaped body. When grain growth occurs isotropically, the two faces present in the surfaces of the sheet expand naturally. Consequently, it is possible to easily obtain grains having a large aspect ratio, which is preferable. For the same reason, a columnar shape, such as a hexagonal columnar shape or octagonal columnar shape, is also preferable. Preferably, the inorganic materials form an oxide having a perovskite structure. Furthermore, preferably, crystals formed after firing are composed of an oxide represented by general formula $ABO_3$, wherein the A site contains at least one element selected from the group consisting of Li, Na, and K, and the B site contains at least one element selected from the group consisting of Nb and Ta. For example, when inorganic materials which form $NaNbO_3$ in which part of the A site is replaced with Li, K, or the like and part of the B site is replaced with Ta or the like, i.e., $(Li_XNa_YK_Z)Nb_MTa_NO_3$ (wherein X, Y, Z, M, and N are arbitrary numbers), are used, the growth form at 900° C. to 1,300° C. is a cubic shape, which is preferable. An element other than those described above may be added. Furthermore, in inorganic materials which form crystals having $(Bi_{0.5}Na_{0.5-x}K_x)TiO_3$ as a main component, when X>0.01, the growth form is a cubic shape, which is preferable. Furthermore, inorganic materials which form crystals including an oxide represented by general formula $ABO_3$, wherein the A site contains Pb as a main component and the B site contains at least one element selected from the group consisting of Mg, Zn, Nb, Ni, Ti, and Zr are also preferable. Furthermore, when glass having a melting point of 1,000° C. or lower, such as lead borate glass, zinc borate glass, borosilicate glass, lead silicate glass, zinc silicate glass, or bismuth silicate glass, is added as a flux in an amount of 0.1% by weight or more, the growth form at 900° C. to 1,300° C. is more likely to be a cubic shape, which is preferable. In this case, in view of dispersibility of glass, preferably, instead of forming glass powder directly into a sheet, the glass powder is calcined so as to be dispersed sufficiently, the calcined material is pulverized, and using the pulverized powder, the ceramic sheet is formed.

The first inorganic material used for the first sheet is preferably an oxide represented by general formula $ABO_3$ which is A-site rich, wherein the A site can contain Li, Na, and K, and the B site can contain Nb. The term "A-site rich" means that the compositional ratio of "A" is higher than that of "B". In the first inorganic material, preferably, raw materials are prepared such that the ratio of the A site to the B site, A/B, will be 1.0 to 1.1. When the A/B is in the range of 1.0 to 1.1, it is possible to increase the aspect ratio and the degree of orientation of crystals contained in the fired ceramic sheet. As the second inorganic material used for the second sheet, a material in which grain growth temperature is higher than that of the first inorganic material is used. The grain growth temperature of the second inorganic material is preferably at least 50° C. or more, more preferably 100° C. or more, and most preferably 200° C. or more higher than that of the first inorganic material. If the grain growth temperature of the second inorganic material is 50° C. or more higher than that of the first inorganic material, grain growth in the first inorganic material and grain growth in the second inorganic material can be easily carried out separately. The term "grain growth temperature" is defined as a temperature at which the grain diameter after firing becomes twice or more the grain diameter before firing when a shaped body of an inorganic material is fired and observed with an electron microscope. The grain growth temperature of the second inorganic material can be increased by preparing the second inorganic material so as to have a different composition from the first inorganic material, by adding a grain-growth accelerator, such as a low-melting-point compound, to the first inorganic material, by adding a grain-growth retardant to the second inorganic material, or by preparing the second inorganic material so as to have a different grain size distribution. The second inorganic material is preferably A-site poor, and in the oxide represented by general formula $ABO_3$ wherein the A site contains Li, Na, and K, and the B site contains Nb, an oxide in which the A site contains Li, Na, and K and the B site contains Nb and Ta can be used. When the first inorganic material and the second inorganic material diffuse each other during firing to form a uniform composition, the composition of the first inorganic material and the composition of the second inorganic material can be set appropriately according to the composition of the intended crystallographically-oriented ceramic.

In the preparation step of preparing inorganic materials, preferably, raw materials for the inorganic materials are pulverized and mixed, the mixed powder is calcined, and the resulting inorganic materials are further pulverized. As the raw materials for the inorganic materials, oxides, hydroxides, carbonates, sulfates, nitrates, tartrates, or the like of the desired components may be used. Preferably, oxides and carbonates are mainly used. In the pulverization of the inorganic materials, the particle diameter is preferably set according to the thickness of the sheet. The median diameter (D50) of the inorganic materials is preferably in the range of 5% to 60% of the thickness of the sheet. If the median diameter is 5% or more of the thickness of the sheet, pulverization can be easily performed. If the median diameter is 5% or more of the thickness of the sheet, pulverization can be more easily performed. If the median diameter is 60% or less of the thickness of the sheet, the thickness of the sheet can be easily adjusted. The particle diameter is determined using a method in which inorganic materials are dispersed in a dispersion medium (organic solvent, water, or the like), and the particle diameter is measured using a laser diffraction/scattering particle size distribution analyzer. The pulverization of the inorganic materials is preferably conducted by wet pulverization. For example, a ball mill, a bead mill, a trommel, an attritor, or the like may be used.

(2) Sheet Shaping Step

The inorganic materials are formed into planar shaped bodies. Here, a first sheet with a thickness of 10 μm or less containing the first inorganic material and a second sheet containing the second inorganic material are formed. The sheet shaping can be conducted, for example, by a doctor-blade method using a slurry containing the inorganic material, or extrusion molding using a puddle containing the inorganic material. When the doctor-blade method is used, for example, a slurry is applied to a flexible supporting member (e.g., organic polymer film, such as PET film), the applied slurry is solidified by drying to form a shaped body, and the shaped body is separated from the supporting member. Thereby, a sheet is obtained. When a slurry or a puddle is prepared before shaping, the inorganic material may be dispersed in an appropriate dispersion medium, and a binder, a plasticizer, or the like may be appropriately added thereto. The slurry is preferably adjusted so as to have a viscosity of 500 to 700 cP and is preferably defoamed under reduced pressure. Examples of other methods that may be used include high-speed spraying of particles, such as aerosol deposition; and a method in which a film is formed on a supporting member made of a resin, glass, ceramic, metal, or the like by a vapor-phase method, such as sputtering, CVD, or PVD, and then the film is separated from the supporting member to obtain a sheet. In this case, since the density of the sheet can be increased, grain growth proceeds at low temperature, volatilization of constituent elements can be prevented, and the resulting ceramic sheet has high density, all of which are advantageous.

The thickness of the first sheet is 10 μm or less, preferably 5 μm or less, and more preferably 2 μm or less. At 10 μm or less, a high degree of orientation can be obtained, and at 5 μm or less, a higher degree of orientation can be obtained. The thickness of the sheet is preferably 0.1 μm or more. If the thickness of the sheet is 0.1 μm or more, a planar sheet can be easily formed. The thickness of the second sheet is not particularly limited, but may be set relative to the thickness of the first sheet so as to meet the composition of the crystallographically-oriented ceramic obtained after completion of the individual steps. Preferably, the thickness of the second sheet is larger than the thickness of the first sheet. In such a case, when grain growth of the first inorganic material contained in the first sheet is allowed to occur, the first sheet is easily supported by the second sheet in which grain growth does not occur at that temperature, and the grain growth of the first inorganic material is easily promoted. The thickness of the second sheet is preferably five times or less, and more preferably twice or less the thickness of the first sheet. If the thickness of the second sheet is five times or less the thickness of the first sheet, after grain growth is carried out in the first inorganic material, grain growth is easily carried out in the second inorganic material using the first inorganic material in which grain growth has occurred as a nucleus.

(3) Laminating Step of Shaped Sheets

Figure 1B:
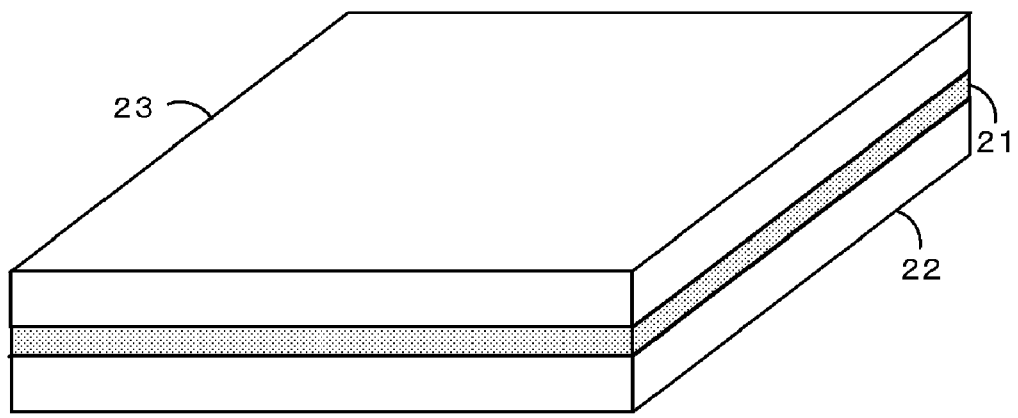
Figure 1C:
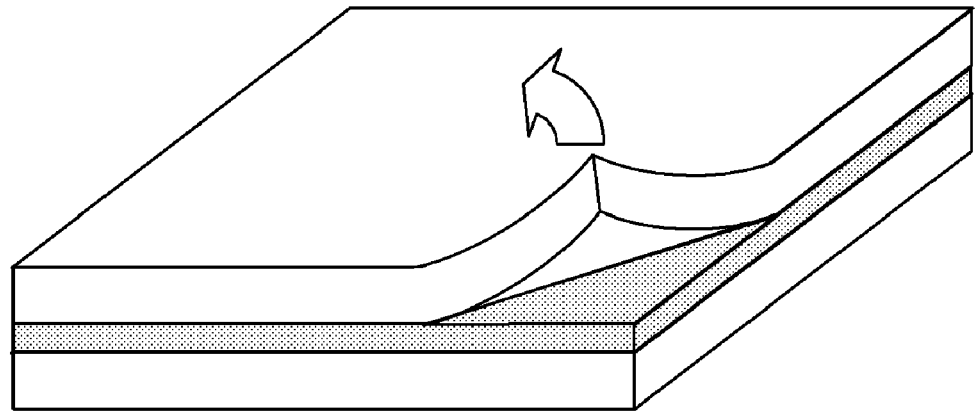

The shaped first sheet and second sheet are laminated. In the laminating step, first sheets and second sheets may be alternately laminated such that each of the bottom layer and the top layer corresponds to a first sheet. Alternatively, first sheets and second sheets may be alternately laminated such that each of the bottom layer and the top layer corresponds to a second sheet. In the former case, since the second sheet is sandwiched between the first sheets containing the first inorganic material which serves as a nucleus for the grain growth of the second inorganic material, the crystallographic orientation of the second sheets adjacent to the top and bottom layers can be further enhanced. In the latter case, since the first sheet is sandwiched between the second sheets containing the second inorganic material in which grain growth occurs at a higher temperature, it is possible to further suppress the laminated body from adhering to a board on which the laminated body is placed during firing. Furthermore, lamination may be performed such that the bottom layer and the top layer are composed of different sheets. FIGS. 1A to 1C are views schematically showing an example of a laminating step, FIG. 1A showing the individual sheets, FIG. 1B showing a state in which the sheets are pressure-bonded to each other, FIG. 1C showing a supporting member being removed. In these and subsequent drawings, a first sheet 21 is shaded. As shown in FIG. 1A, a first sheet 21 formed on a supporting member 23, such as a PET film, is placed so as to face a second sheet 22. The first sheet 21 and the second sheet 22 are pressure-bonded to each other (FIG. 1B), and then, the supporting member 23 is removed (FIG. 1C). Subsequently, a new second sheet 22 is placed so as to face the first sheet 21, and pressure bonding is performed. This operation is repeated until a desired number of sheets are laminated. The pressure bonding between the first sheet 21 and the second sheet 22 is performed to such an extent that the first sheet 21 is not separated from the second sheet 22 when the supporting member 23 is peeled off. Preferably, a laminating pressure is applied to the resulting laminated body using a pressing machine. The laminating pressure is preferably set at about 100 kg/cm². Preferably, the laminating pressure is applied under heating. The heating is performed preferably at about 80° C. Instead of sheet shaping, the first sheet 21 may be formed by applying the material by screen-printing or the like onto the second sheet 22. Furthermore, both the first and second sheets may be formed by applying the materials by screen-printing, and printing and drying may be alternately repeated to form a desired laminated body. Furthermore, a laminated body may be formed directly on a substrate by screen-printing or the like. In such a case, a crystallographically-oriented ceramic is obtained in a state of being bonded to the substrate.

(4) Firing Step of Laminated Body

Subsequently, the laminated body obtained in the laminating step is fired. In the firing step, first firing is carried out at a temperature equal to or higher than the grain growth temperature of the first inorganic material and lower than the grain growth temperature of the second inorganic material to cause grain growth in the first inorganic material. Then, second firing is carried out at a temperature equal to or higher than the grain growth temperature of the second inorganic material to cause grain growth in the second inorganic material in the direction of the crystal plane of the first inorganic material. For example, even if the first inorganic material grows into crystal grains with an isotropic and polyhedral shape, it is possible that a specific crystal plane may be grown depending on the situation. Here, even if inorganic particles that grow into crystal grains with an isotropic and polyhedral shape are included, since the thickness of the first sheet 21 is 10 μm or less, grain growth in the thickness direction of the sheet is limited and grain growth is more promoted in the surface direction of the sheet. Consequently, a specific crystal plane grows in the surface of the sheet, and thus the aspect ratio and the degree of orientation are increased. The first firing and the second firing may be performed separately. Alternatively, the second firing may be performed continuously subsequent to the first firing. In view of energy saving, preferably, the second firing is performed continuously subsequent to the first firing. In the first firing, preferably, firing is performed at a temperature that is higher, by 10 percent or more, than the firing temperature at which the growth form of crystals of the first inorganic material is obtained by firing, for example, the firing temperature at which densification and grain growth are caused by firing a bulk. At the temperature higher by 10 percent or more, grain growth in the first sheet 21 with a thickness of 10 μm or less can be promoted sufficiently. Preferably, firing is performed at a high temperature to such an extent that the material of the laminated body is not decomposed. In particular, when the thickness of the sheet is decreased, grain growth does not easily proceed, and therefore, it is preferable to increase the firing temperature. In the second firing, preferably, firing is performed by increasing the temperature to such an extent that grain growth occurs in the second inorganic material and the material of the laminated body is not decomposed. When the thickness of the second sheet 22 is 10 μm or less, as in the first inorganic material, as the thickness of the sheet is decreased, the firing temperature is preferably increased.

For example, in the firing step of an inorganic material composed of $NaNbO_3$ in which Li, K, or the like is substituted to the A site and Ta is substituted to the B site, i.e., (($Li_X$-$Na_YK_Z$)$Nb_MTa_NO_3$), the firing temperature for the first sheet 21 in the first firing is preferably set at 850° C. to 1,000° C. At a firing temperature of 850° C. or higher, crystal growth of the particles is promoted, which is preferable. At a temperature of 1,000° C. or lower, volatilization of an alkaline component or the like can be reduced, and decomposition of the material can be suppressed. Furthermore, the firing temperature for the second sheet 22 in the second firing is preferably set at 1,050° C. to 1,200° C. At a firing temperature of 1,050° C. or higher, crystal growth of the particles is promoted, which is preferable. At a temperature of 1,200° C. or lower, volatilization of an alkaline component or the like can be reduced, and decomposition of the material can be suppressed.

Preferably, the laminated body is fired in a state in which volatilization of a specific component (e.g., alkaline component) contained in the laminated body is suppressed. By suppressing a specific component from being volatilized from the laminated body, it is possible to prevent the composition of the fired crystallographically-oriented ceramic from varying. For example, in order to suppress volatilization, the laminated body may be fired in a state in which another inorganic material coexists with the inorganic material constituting the laminated body. In such a manner, since a specific component is volatilized from the coexisting inorganic material, it is possible to relatively easily suppress the specific component from being volatilized from the laminated body. In this case, "another inorganic material" may be the first inorganic material or the second inorganic material, or may have the same composition as that of the entire laminated body. The shape of another inorganic material may be in the form of powder or a shaped body. Alternatively, in order to achieve the volatilization-suppressing state, the laminated body may be placed in a covered sheath or the like and fired in a sealed state. Preferably, the space in the sheath is decreased as much as possible. It is important to empirically set the inner volume of the sheath, the amount of the shaped body, the amount of the inorganic material allowed to coexist, and the like to be appropriate so that the atmosphere in the sheath is in an optimum state. The firing atmosphere may be air. Alternatively, in view of suppression of volatilization of the constituent elements, reactivity with the inactive layer, and the like, the atmosphere may be an oxygen atmosphere; a neutral atmosphere, such as nitrogen; a reducing atmosphere in the presence of hydrogen or a hydrocarbon; or a vacuum. Furthermore, from the standpoint of accelerating densification, firing under pressure, such as hot pressing, may be performed.

Figure 2A:
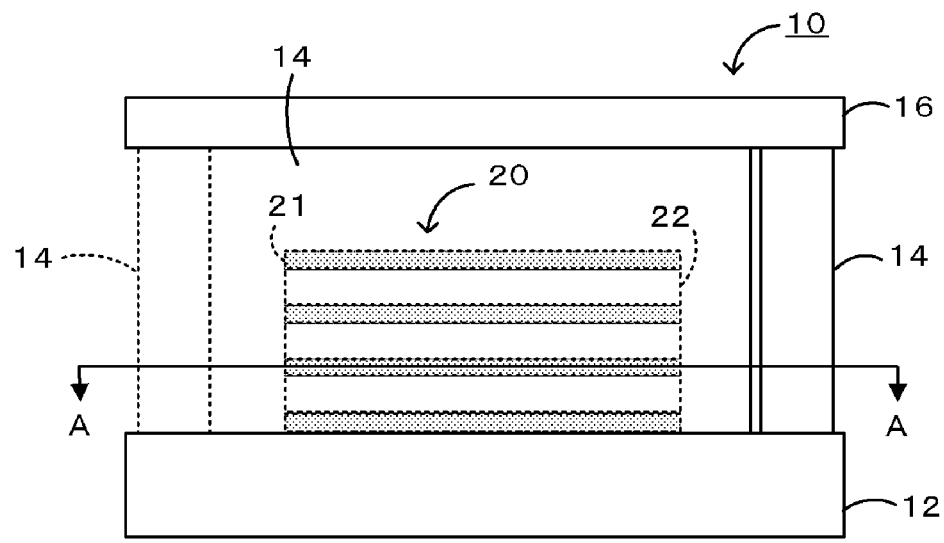
FIG. 2A is a side view which schematically shows a firing apparatus.
Figure 2B:
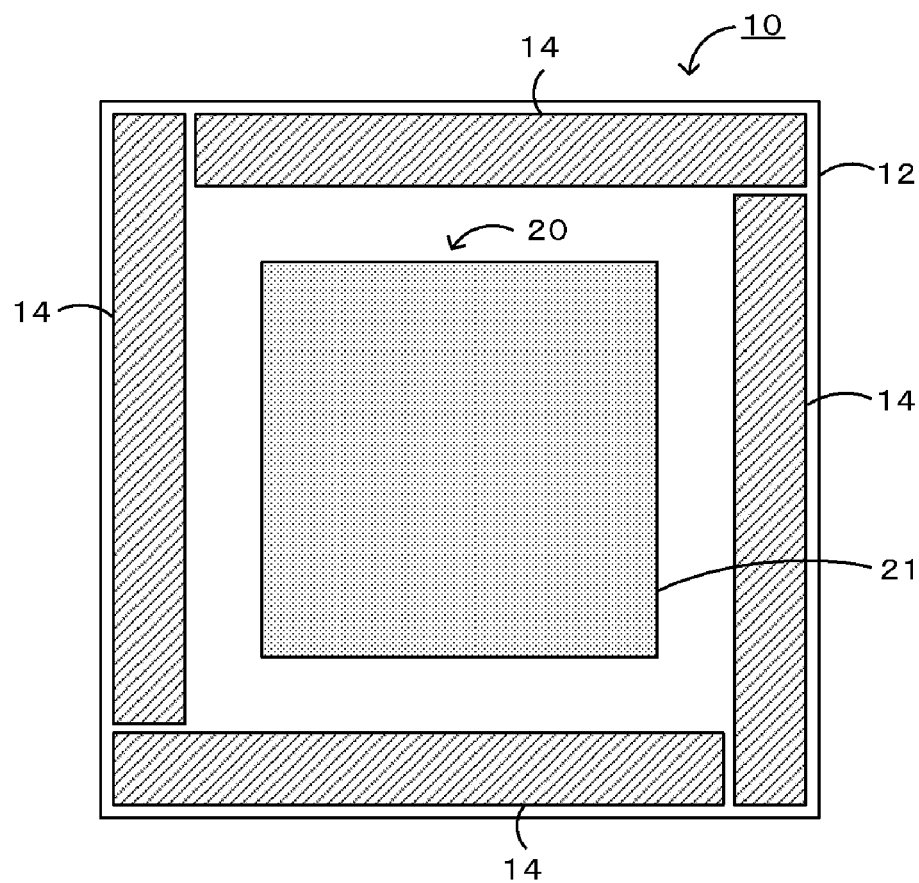
FIG. 2B is a cross-sectional view taken along the line A-A of FIG. 2A.

The firing step will be described with reference to the drawings. FIG. 2A is a side view which schematically shows a firing apparatus 10, and FIG. 2B is a cross-sectional view taken along the line A-A of FIG. 2A. The firing apparatus 10 is used when a laminated body 20 is fired in a firing furnace which is not shown. The firing apparatus 10 includes a setter 12 on which a green laminated body 20 is placed and which is a fired ceramic plate, coexisting green shaped bodies 14 which are composed of the same inorganic material as that of the laminated body 20 and have a thickness larger than that of the laminated body 20, and a quadrangular plate 16 which is placed on the coexisting green shaped bodies 14 and which is a fired ceramic plate serving as a cover for the laminated body 20. As shown in FIG. 2B, by surrounding four sides of the laminated body 20 with the coexisting green shaped bodies 14, it is possible to prevent volatilization of a specific component (e.g., alkaline component) from the laminated body 20 and a change in the composition. When an inorganic material in the form of powder is allowed to coexist inside the sheath instead of allowing green shaped bodies to coexist, by adjusting the manner of placing the setter, the size of the setter, the stacking method, the position of placement of the powder inside the sheath, and the like, it is possible to homogeneously control the atmosphere in the sheath. Thus, when a plurality of shaped bodies are fired, the individual shaped bodies can have a homogeneously oriented crystal structure. In this example, the setter 12 is planar. It is also possible to use a setter in which the contact area with the laminated body 20 is decreased so as to prevent adhesion between the setter 12 and the laminated body 20. Examples of such a setter include a setter in which the sheet-placing surface is roughened, a honeycomb-shaped setter in which a plurality of through-holes are formed in the sheet-placing surface, and a dimpled setter. Furthermore, a method may be used in which alumina powder or zirconia powder that is stable at the firing temperature of the laminated body 20 is spread over the sheet-placing surface of the setter 12, the laminated body 20 is placed thereon, and then firing is performed.

Figure 3A:
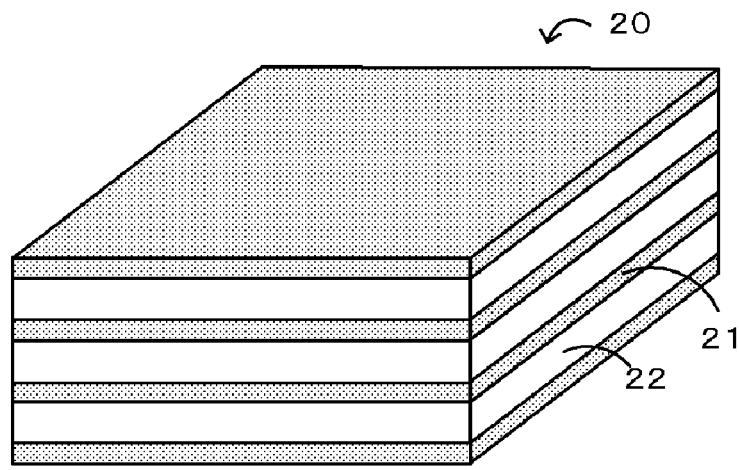
FIG. 3A is a schematic view showing a laminated body before firing.
Figure 3B:
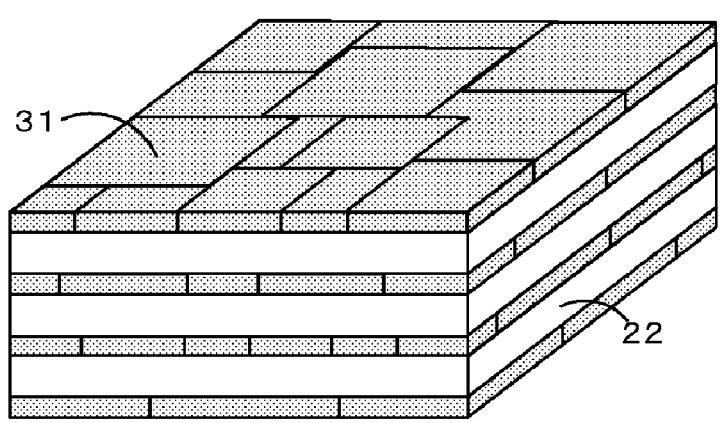
FIG. 3B is a schematic view showing a laminated body in which grain growth has occurred in a first inorganic material.
Figure 3C:
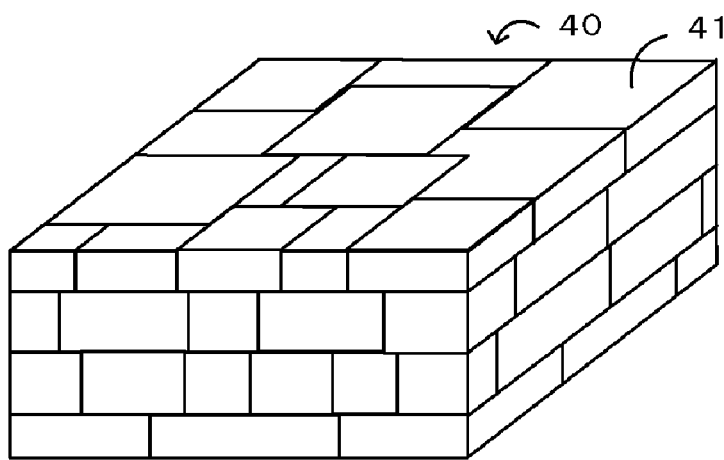
FIG. 3C is a schematic view showing a crystallographically-oriented ceramic in which grain growth has occurred in a second inorganic material.

Such a firing apparatus 10 is placed in a firing furnace, the temperature is increased to a first temperature at which grain growth occurs in the first inorganic material, and then the temperature is increased to a second temperature at which grain growth occurs in the second inorganic material. FIG. 3A is a schematic view showing a laminated body 20 before firing, FIG. 3B is a schematic view showing a laminated body 30 in which grain growth has occurred in a first inorganic material, and FIG. 3C is a schematic view showing a crystallographically-oriented ceramic 40 in which grain growth has occurred in a second inorganic material. Specifically, the temperature is increased to the first temperature at a predetermined heating rate (e.g., 100° C. to 200° C./h), and the first temperature is maintained for a predetermined period of time (e.g., 2 to 5 hours). Since the thickness of the first sheets 21 is small at 10 μm or less, grain growth of the first inorganic material in the thickness direction is limited, and grain growth is more promoted in a direction along the contact surfaces with the second sheets 22. As a result, first grains 31 with an anisotropic shape are generated (FIG. 3B). Next, the temperature is increased to the second temperature at which grain growth occurs in the second inorganic material at a predetermined heating rate (e.g., 100° C. to 200° C./h), and the second temperature is maintained for a predetermined period of time (e.g., 2 to 5 hours). Grain growth occurs in the second inorganic material along the direction of the grains of the first inorganic material, using, as a nucleus, the first inorganic material in which grain growth has already occurred (FIG. 3C). In this stage, the first inorganic material and the second inorganic material diffuse each other to form a uniform composition in the entire ceramic.

As described above, even when the first inorganic material grows into either crystal grains with an anisotropic shape or crystal grains with an isotropic and polyhedral shape, in the first organic material, grain growth proceeds along the contact surfaces with the second sheets 22, and even when the second inorganic material grows into either crystal grains with an anisotropic shape or crystal grains with an isotropic and polyhedral shape, in the second inorganic material, grain growth proceeds along a direction in which grains have grown in the first inorganic material. Furthermore, since the laminated body 20 is fired in the volatilization-suppressing state, it is possible to obtain a crystallographically-oriented ceramic 40 having a compositional ratio closer to the intended one. Subsequently, the temperature is decreased to room temperature, and thereby, it is possible to obtain a crystallographically-oriented ceramic 40 including oriented crystals 41 in which the crystal planes are oriented in a predetermined direction.

The resulting crystallographically-oriented ceramic 40 can be used as a piezoelectric member or an electrostrictive member. When the crystallographically-oriented ceramic 40 is used as a piezoelectric member or an electrostrictive member, crystallographically-oriented ceramics 40 and electrodes may be alternately stacked on a substrate. Although the method of producing the crystallographically-oriented ceramic 40 which does not include electrodes has been described above, it may be also possible to produce a crystallographically-oriented ceramic 40 in which electrodes are formed by a method in which electrodes are disposed at given positions on the laminated first sheets 21 and second sheets 22, and then the firing step described above is carried out. In such a manner, orientation of grains and formation of electrodes can be performed by one firing step, thus increasing production efficiency.

In the method for producing the crystallographically-oriented ceramic according to the embodiment described above, a first sheet 21 with a thickness of 10 μm or less containing a first inorganic material in which grain growth occurs at a first temperature or higher and a second sheet 22 containing a second inorganic material in which grain growth occurs at a second temperature higher than the first temperature are formed, a laminated body 20 is formed by laminating one or more each of the first sheet 21 and the second sheet 22, and then the laminated body 20 is fired at a temperature equal to or higher than the first temperature and lower than the second temperature to cause grain growth in the first inorganic material. In this stage, since the first sheet 21 has a thickness of 10 μm or less, grain growth in the thickness direction of the sheet is limited in the first inorganic material, and grain growth is more promoted in a direction along the contact surface with the second sheet 22. Subsequently, by firing at a temperature equal to or higher than the second temperature, grain growth is caused in the second inorganic material contained in the second sheet 22. In this stage, in the second inorganic material, grain growth proceeds along the direction of the grains of the first inorganic material which have grown along the contact surface. In such a manner, grain growth occurs in a certain direction as a whole. Consequently, it is possible to enhance crystallographic orientation by simple processing compared with a case where a first inorganic material in which grain growth has been caused by firing is crushed, the crushed first inorganic material is mixed and shaped with a second inorganic material, and the resulting shaped body is fired again. Furthermore, in the firing step, subsequent to firing at the first temperature, firing at the second temperature is performed, and thus the firing step can be simplified. Consequently, it is possible to enhance crystallographic orientation with a smaller amount of energy. Moreover, since the crystallographically-oriented ceramic 40 can be produced by a series of steps, including the raw material preparation step, the shaping step, the lamination step, and the firing step, it is possible to enhance crystallographic orientation by processing for a shorter period of time. Furthermore, the thickness of the first sheet 21 is 10 μm or less, and grain growth of the first inorganic material is more promoted in a direction along the contact surface with the second sheet 22. Therefore, even a material which usually grows into crystal grains with an isotropic and polyhedral shape can be effectively used as a material that grows into crystal grains with an anisotropic shape and enhances crystallographic orientation.

It is to be understood that the present invention is not limited to the embodiment described above, and various embodiments within the scope of the technical field of the present invention can be carried out.

For example, although the first sheet 21 is formed into a planar shape in the embodiment described above, as shown in FIGS. 4A and 4B, a plurality of through-holes 24 may be provided in a first sheet 21 to form a first sheet 21B, and a laminated body 20B may be formed in which two second sheets 22 are connected through a second inorganic material which has filled in the through-holes 24 of the first sheet 21B. Specifically, after a first sheet 21 is formed on a supporting member 23, through-holes 24 are provided therein by punching or the like to form a first sheet 21B. A planar second sheet 22 is formed as in the embodiment described above. The first sheets 21B provided with the through-holes 24 and the second sheets 22 are laminated as in the embodiment described above (FIG. 4A). Preferably, lamination is performed such that the through-holes 24 of the two adjacent first sheets 21B are not aligned. Then, pressure is applied to the laminated body, for example, under heating. Thus, pressure-bonding is performed such that parts of the second sheets 22 fill in the through-holes 24 (FIG. 4B). In such a manner, due to the anchor effect of the second inorganic material which has filled in the through-holes 24, delamination between the first sheet 21 and the second sheet 22, which may occur during firing, can be prevented. Alternatively, a plurality of through-holes may be provided in the second sheet 22, and a laminated body may be formed in which two first sheets are connected through a first inorganic material which has filled in the through-holes of the second sheet 22. In this case, due to the anchor effect of the first inorganic material which has filled in the through-holes, delamination between the first sheet 21 and the second sheet 22, which may occur during firing, can be prevented.

In the embodiment described above, the firing step of the laminated body is carried out in two stages. That is, the temperature is increased to the first temperature at which grain growth occurs in the first inorganic material, the first temperature is maintained for a predetermined period of time, then the temperature is increased to the second temperature at which grain growth occurs in the second inorganic material, and the second temperature is maintained for a predetermined period of time. However, it may be possible to omit the maintaining of the first temperature for a predetermined period of time. For example, in the process of increasing the temperature to the second temperature, when the first temperature is reached, grain growth is allowed to occur in the first inorganic material, and when the second temperature is reached, grain growth is allowed to occur in the second inorganic material, following the first inorganic material in which grain growth has proceeded. In this case, preferably, the heating rate is set so that grains grow sufficiently in the first inorganic material. In such a manner, the same effect as that in the embodiment described above can be obtained. In the embodiment described above, firing is performed in two stages at different temperatures. However, firing may be performed in three or more stages at different temperatures.

EXAMPLES

Examples in which crystallographically-oriented ceramics 40 are specifically produced will be described below.

Example 1

(Preparation Step of Preparing Inorganic Materials)

Powders ($Li_2CO_3$, $Na_2CO_3$, $K_2CO_3$, $Nb_2O_5$, and $Ta_2O_5$) were weighed so that a first inorganic material was composed of $Li_{0.03}(Na_{0.475}K_{0.475})_{1.03}NbO_{3.015}$ (an oxide represented by general formula $ABO_3$ which is A-site rich) and a second inorganic material was composed of $Li_{0.03}(Na_{0.475}K_{0.475})_{0.98}Nb_{0.7}Ta_{0.3}O_{2.999}$ (A-site poor). With respect to each of the first and second inorganic materials, the weighed powders, zirconia balls, and ethanol as a dispersion medium were placed in a plastic pot, and wet mixing and pulverization were performed using a ball mill for 16 hours. The resulting slurry was dried using an evaporator and a dryer, and then calcination was performed at 850° C. for 5 hours. The calcined powder, zirconia balls, and ethanol as a dispersion medium were subjected to wet pulverization using a ball mill for 5 hours, followed by drying using an evaporator and a dryer. Thereby, inorganic material powders composed of $Li_{0.03}(Na_{0.475}K_{0.475})_{1.03}NbO_{3.015}$ and $Li_{0.03}(Na_{0.475}K_{0.475})_{0.98}Nb_{0.07}Ta_{0.03}O_{2.999}$ were obtained. The average particle diameter of each powder was measured with a laser diffraction/scattering particle size distribution analyzer LA-750 manufactured by HORIBA, Ltd. using water as a dispersion medium. As a result, the median diameter (D50) was 0.6 μm. The grain growth temperature of the first inorganic material was about 850° C., and the grain growth temperature of the second inorganic material was 1,050° C.

(Shaping Step of Forming Sheets)

Either one of the inorganic material powders, polyvinyl butyral (BM-2, manufactured by Sekisui Chemical Co., Ltd.) as a binder, a plasticizer (DOP, manufactured by Kurogane Kasei Co., Ltd.), and a dispersant (SP-O30, manufactured by Kao Corporation) were mixed into a dispersion medium obtained by mixing equal amounts of toluene and isopropanol to prepare a shaping material in the form of a slurry. The amounts of the individual materials used were 100 parts by weight of the dispersion medium, 10 parts by weight of the binder, 4 parts by weight of the plasticizer, and 2 parts by weight of the dispersant on the basis of 100 parts by weight of the inorganic material. The resulting slurry was defoamed by stirring under reduced pressure so that the viscosity was adjusted to 500 to 700 cP. The viscosity of the slurry was measured using an LVT viscometer manufactured by Brookfield. The resulting slurry was formed into a sheet on a PET film as a supporting member 23 by a doctor-blade method. The thickness after drying was set at 5 μm for a first sheet 21 containing the first inorganic material and 10 μm for a second sheet 22 containing the second inorganic material. The composition of the intended crystallographically-oriented ceramic 40 was $Li_{0.03}Na_{0.475}K_{0.475}Nb_{0.82}Ta_{0.18}O_3$. The thickness of each sheet was set so that the intended composition and the second inorganic material only contained Ta.

(Laminating Step of Laminating Sheets)

Each of the first sheet 21 and the second sheet 22 were cut into a size of 20 mm×20 mm. The first sheets 21 and the second sheets 22 were alternately laminated so that each of the bottom layer and the top layer corresponded to the first sheet 21 and the total number of layers was 21. A first sheet 21 formed on a supporting member 23 was provisionally pressure-bonded to a second sheet 22, and then the supporting member 23 was peeled off. This operation was repeated to form a laminated body 20 (thickness: about 150 μm). A laminating pressure of 100 kg/cm² was applied to the resulting laminated body 20 using a pressing machine at 80° C.

(Firing Step of Laminated Body)

The laminated body 20 was placed in the center of a setter 12 made of zirconia (size: 70 mm square, height: 5 mm). Green shaped bodies (size: 5 mm×40 mm, thickness: 300 μm) composed of the same shaping raw materials as those for the second sheet 22 were placed on the setter 12 outside the four sides of the laminated body 20 so as surround the laminated body 20, and a quadrangular plate made of zirconia (size: 70 mm square, height: 5 mm) was further placed thereon. In such a manner, the space around the sheet-like shaped body was minimized, and the same shaping raw materials were allowed to coexist for firing. Degreasing was performed at 600° C. for 2 hours, then the temperature was increased at a heating rate of 200° C./h, and firing was performed at 900° C. for 2 hours to cause grain growth in the first inorganic material contained in the first sheets 21. Subsequently, the temperature was increased at a heating rate of 200° C./h, and firing was performed at 1,100° C. for 5 hours to cause grain growth in the second inorganic material contained in the second sheets 22. After firing, a portion not adhering to the setter 12 was retrieved, and thereby, a crystallographically-oriented ceramic 40 of Example 1 was obtained.

Example 2

Figure 4A:
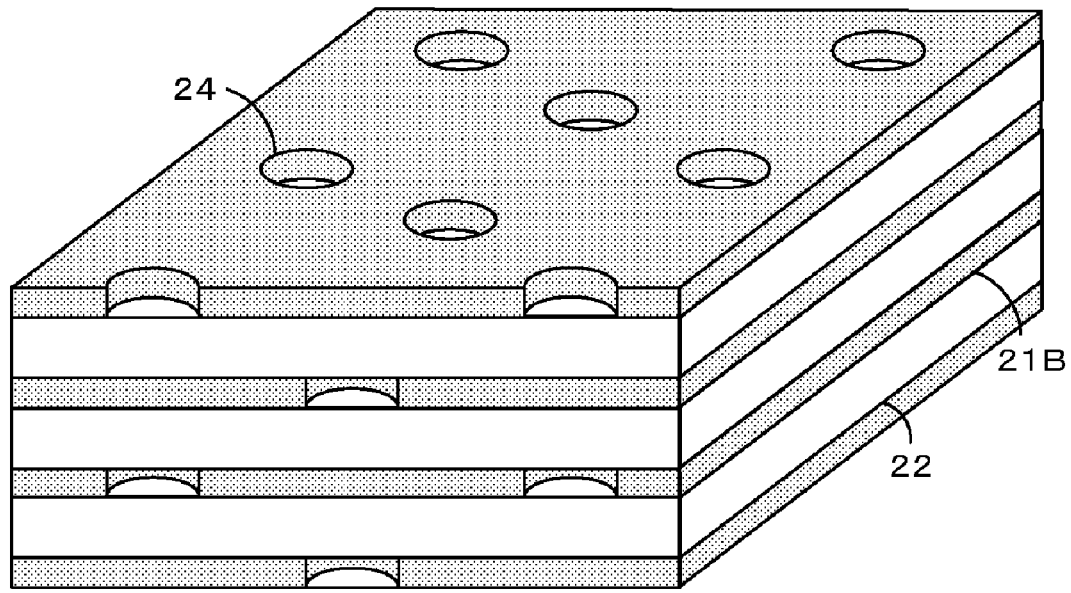
FIG. 4A is a schematic view showing another laminated body obtained by lamination.
Figure 4B:
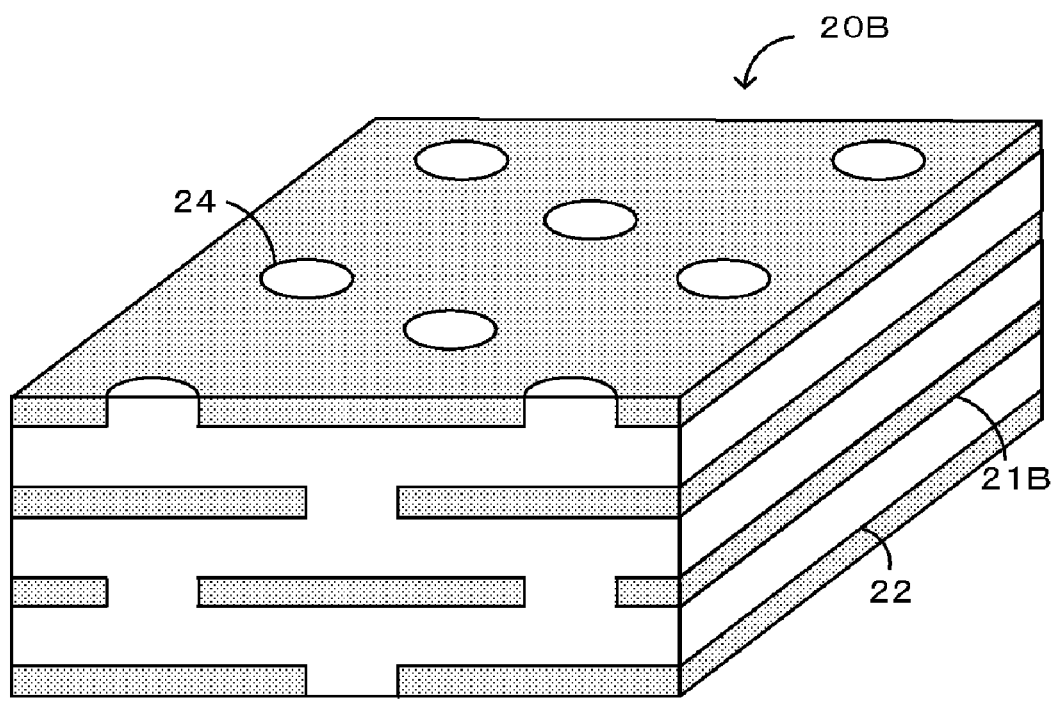
FIG. 4B is a schematic view showing the laminated body after laminating pressure has been applied thereto.

A crystallographically-oriented ceramic 40 was produced as in Example 1 except that, in the shaping step, through-holes 24 of 50 μm were formed by punching in the first sheets 21, and in the laminating step, lamination was performed such that the through-holes 24 of the two adjacent first sheets 21 were not aligned (refer to FIGS. 4A and 4B). After a laminating pressure was applied to the laminated body, a cross-section was checked, and it was found that the through-holes 24 were filled with the second inorganic material. In Example 2, it was evident that delamination did not easily occur during firing.

Example 3

In the preparation step, a $ZnO$—$B_2O_3$—$SiO_2$-based glass powder (ASF1891 manufactured by Asahi Glass (AGG)) (1% by weight) was added to a synthesized powder for a first inorganic material having the composition $0.2Pb(Mg_{0.33}Nb_{0.67})O_3$-$0.35PbTiO_3$-$0.45PbZrO_3$ to which 1% by weight of NiO was added. The weighed mixture, zirconia balls, and ion-exchanged water as a dispersion medium were placed in a plastic pot, and wet mixing was performed using a ball mill for 16 hours. The resulting slurry was dried using a dryer, and then calcination was performed at 800° C. for 2 hours. The calcined powder, zirconia balls, and ion-exchanged water as a dispersion medium were subjected to wet pulverization using a ball mill, followed by drying using a dryer. Thereby, the first inorganic material was obtained. A second inorganic material was prepared as in the first inorganic material without using the $ZnO$—$B_2O_3$—$SiO_2$-based glass powder. The grain growth temperature of the first inorganic material was 950° C., and the grain growth temperature of the second inorganic material was 1,150° C. A crystallographically-oriented ceramic was produced as in Example 1 except that grain growth was allowed to occur at 1,100° C. in the first inorganic material of the laminated body, and grain growth was allowed to occur at 1,200° C. in the second inorganic material.

[Evaluation of Orientation]

With respect to each of the crystallographically-oriented ceramics of Examples 1 to 3, an XRD diffraction pattern was measured when the sheet surface was irradiated with X-ray using an XRD diffraction device (RAD-IB manufactured by Rigaku Corporation). The degree of orientation of the pseudocubic (100) plane was measured by the Lotgering method in which the degree of orientation was calculated according to equation (1) using peaks of pseudocubic (100), (110), and (111) planes. In equation (1), $\Sigma I(HKL)$ is the sum of X-ray diffraction intensities of all crystal planes (hkl) measured in the ceramic sheet; $\Sigma I_0(hkl)$ is the sum of X-ray diffraction intensities of all crystal planes (hkl) measured in a non-oriented ceramic sheet having the same composition as the ceramic sheet; $\Sigma'I(HKL)$ is the sum of X-ray diffraction intensities of crystallographically equivalent specific crystal planes (e.g., (100) plane) measured in the ceramic sheet; and $\Sigma'I_0(HKL)$ is the sum of X-ray diffraction intensities of specific crystal planes measured in a non-oriented ceramic sheet having the same composition as the ceramic sheet. The degree of orientation thus measured by the Lotgering method was 60% or more.

$$\text{Degree of orientation} = \frac{\frac{\Sigma'I(HKL)}{\Sigma I(hkl)} - \frac{\Sigma'I_0(HKL)}{\Sigma I_0(hkl)}}{1 - \frac{\Sigma'I_0(HKL)}{\Sigma I_0(hkl)}} \times 100\% \quad \text{Equation (1)}$$

The present application claims the benefit of the priority from Japanese Patent Application No. 2007-140833 filed on May 28, 2007, Japanese Patent Application No. 2007-283186 filed on Oct. 31, 2007, U.S. Provisional Application No. 60/948,751 filed on Jul. 10, 2007, the entire contents except claims of which are incorporated herein by reference.

What is claimed is:

1. A method for producing a crystallographically-oriented ceramic in which crystals are oriented comprising:

a shaping step of forming a first shaped layer with a thickness of 10 μm or less containing a first inorganic material in which grain growth occurs at a predetermined first temperature or higher and a second shaped layer containing a second inorganic material in which grain growth occurs at a second temperature higher than the first temperature;

a laminating step of laminating one or more each of the first shaped layer and the second shaped layer to form a laminated body; and a firing step of firing the laminated body at a temperature equal to or higher than the first temperature and lower than the second temperature to cause grain growth in the first inorganic material, and then firing the laminated body at a temperature equal to or higher than the second temperature to cause grain growth in the second inorganic material in the direction of a crystal plane of the first inorganic material in which grain growth has occurred, wherein grain growth in the first layer is promoted within the main plane of the layer and is limited in the thickness direction of the layer.

2. The method for producing the crystallographically-oriented ceramic according to claim 1, wherein, in the shaping step, an inorganic material that grows into crystal grains with an isotropic and polyhedral shape under predetermined firing conditions is used as the first inorganic material.

3. The method for producing the crystallographically-oriented ceramic according to claim 1, wherein, in the firing step, the laminated body is fired in a volatilization-suppressing state in which volatilization of a specific component contained in the laminated body is suppressed.

4. The method for producing the crystallographically-oriented ceramic according to claim 3, wherein, in the firing step, the laminated body is fired in the volatilization-suppressing state in which at least one of the first inorganic material and the second inorganic material is made to coexist in addition to the laminated body.

5. The method for producing the crystallographically-oriented ceramic according to claim 1, wherein, in the laminating step, the lamination is performed such that each of the bottom layer and the top layer of the laminated body corresponds to the first shaped layer.

6. The method for producing the crystallographically-oriented ceramic according to claim 1, wherein, in the shaping step, the second shaped layer is formed so as to have a thickness larger than that of the first shaped layer.

7. The method for producing the crystallographically-oriented ceramic according to claim 1, wherein, in the shaping step, an inorganic material that forms a perovskite structure is used.

8. The method for producing the crystallographically-oriented ceramic according to claim 1, wherein, in the shaping step, as each of the first inorganic material and the second inorganic material, an inorganic material that forms an oxide represented by general formula $ABO_3$, wherein the A site contains at least one element selected from the group consisting of Li, Na, and K, and the B site contains at least one element selected from the group consisting of Nb and Ta, is used.

9. The method for producing the crystallographically-oriented ceramic according to claim 1, wherein, in the shaping step, as each of the first inorganic material and the second inorganic material, an inorganic material that forms an oxide represented by general formula $ABO_3$, wherein the A site contains Pb, and the B site contains at least one element selected from the group consisting of Mg, Zn, Nb, Ni, Ti, and Zr, is used.

10. The method for producing the crystallographically-oriented ceramic according to claim 1, wherein, in the shaping step, the first shaped layer is formed so as to have a through-hole in a contact surface to be in contact with the second shaped layer, and in the laminating step, the through-hole is filled with the second inorganic material.

11. The method for producing the crystallographically-oriented ceramic according to claim 1, wherein, in the shaping step, the second shaped layer is formed so as to have a through-hole in a contact surface to be in contact with the first shaped layer, and in the laminating step, the through-hole is filled with the first inorganic material.

* * * * *